(12) United States Patent
Shinomiya

(10) Patent No.: US 8,089,109 B2
(45) Date of Patent: Jan. 3, 2012

(54) PHOTOELECTRIC CONVERSION DEVICE AND IMAGING DEVICE

(75) Inventor: Kohji Shinomiya, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 448 days.

(21) Appl. No.: 12/373,402

(22) PCT Filed: Jul. 21, 2006

(86) PCT No.: PCT/JP2006/314472
§ 371 (c)(1),
(2), (4) Date: Feb. 13, 2009

(87) PCT Pub. No.: WO2008/010292
PCT Pub. Date: Jan. 24, 2008

(65) Prior Publication Data
US 2009/0302360 A1 Dec. 10, 2009

(51) Int. Cl.
*H01L 27/146* (2006.01)

(52) U.S. Cl. ........ 257/292; 257/290; 257/291; 257/293; 257/294; 257/431; 257/E27.133; 257/E27.135

(58) Field of Classification Search .......... 257/290–294, 257/431, E27.133, E27.135
See application file for complete search history.

(56) References Cited

U.S. PATENT DOCUMENTS

| | | | |
|---|---|---|---|
| 7,129,466 B2 | 10/2006 | Iwasaki | |
| 7,218,347 B2 | 5/2007 | Shinohara | |
| 7,470,946 B2 * | 12/2008 | Hsu et al. | 257/292 |
| 7,535,073 B2 * | 5/2009 | Ezaki | 257/440 |
| 7,760,254 B2 * | 7/2010 | Suzuki | 348/272 |
| 2004/0100570 A1 | 5/2004 | Shizukuishi | |

FOREIGN PATENT DOCUMENTS

| | | |
|---|---|---|
| JP | 61-49464 | 3/1986 |
| JP | 61-187282 | 8/1986 |
| JP | 7-074340 | 3/1995 |
| JP | 2003-298038 | 10/2003 |
| JP | 2004-165242 | 6/2004 |
| JP | 2004-186311 | 7/2004 |
| JP | 2006-120845 | 5/2006 |

* cited by examiner

*Primary Examiner* — Cuong Q Nguyen
*Assistant Examiner* — Tran Tran
(74) *Attorney, Agent, or Firm* — Mattingly & Malur, PC

(57) ABSTRACT

A photoelectric conversion device adopts the structure reflecting the finding that color separation by the photoelectric conversion, which utilizes the difference of the PN junction depth of a semiconductor region, has the strong tendency that separation of a B signal is easy but separation of a G signal and an R signal becomes imperfect. That is, to cope with the tendency of the imperfect color separation of a G signal and an R signal, PN junction surfaces (JNC_B, JNC_R) of two photodiodes (PDs) for R light and B light are superimposed in the depth direction, and PD to G light is arranged independently. Accordingly, the color separation property of each RGB light wavelength band can be improved, the occupying area can be reduced compared with the case where each PD of RGB light is dispersed in the plane direction, and simplification of the semiconductor layer structure can be realized.

12 Claims, 12 Drawing Sheets

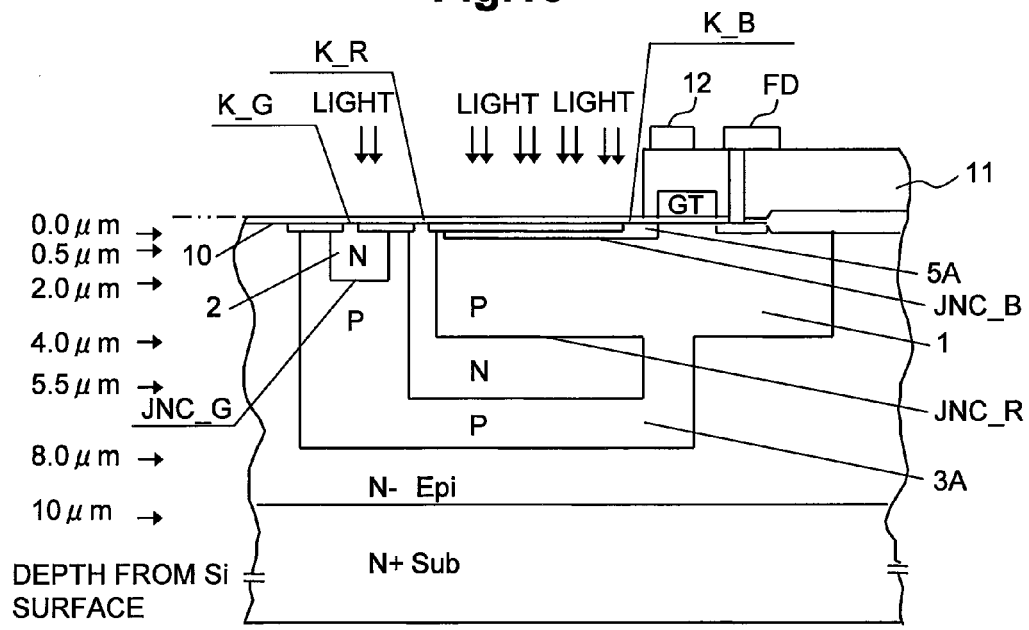
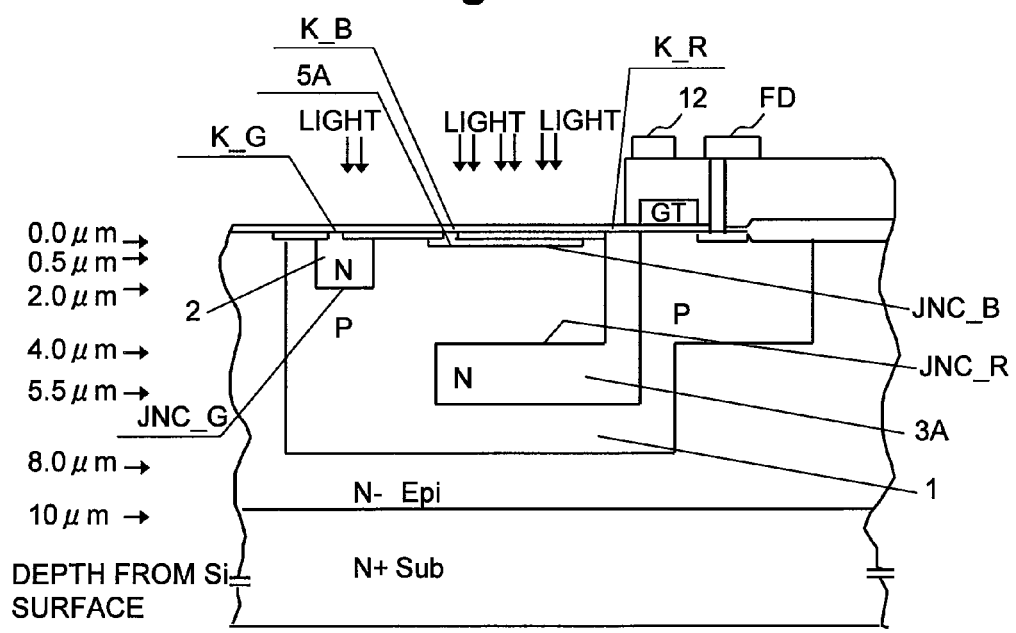

PHOTOELECTRIC CONVERSION DEVICE AND IMAGING DEVICE

TECHNICAL FIELD

The present invention relates to a photoelectric conversion device used for detection of a color image, and to technology which is effective when applied to an image input device, such as a camera or a solid-state imaging device, for example.

BACKGROUND ART

In the past, a color filter (written as CF in the following) to pass the light of red, green, and blue (written as RGB in the following) is inserted in a light path to a pixel, and photoelectric conversion is performed with a photodiode (written as PD in the following) formed in the pixel. Consequently, a color image is produced with the constitution in which a red, green, and blue (RGB) electrical signal are independently obtained for every pixel respectively.

Since the system which performs a color separation by the RGB-CF requires a pixel dedicated for every color, three RGB pixels are necessary in order to obtain a color electrical signal in a set of at least three pixels, such as RGB.

Since it is necessary to make light transmit an RGB-CF, light energy is converted into heat by the RGB-CF and decreases, and the transmitted light energy which has decreased is irradiated to PD. Therefore, there arises a problem that the photoelectron after photoelectric conversion decreases and an output chrominance signal is reduced, as well as a problem that the heat generation by the RGB-CF varies the spectroscopic property of the RGB-CF. Another problem is decrease of light use efficiency, due to the thickness of the RGB-CF layer which narrows the angle of available incident light. Since a pigment is used for the material of an RGB-CF, in order to protect a wafer manufacturing process line from contamination by the heavy metal included in the pigment, an exclusive RGB-CF manufacturing line, separated from the wafer manufacturing process line, needs to be provided.

As a means to solve these problems, Patent Document 1 and Patent Document 2 propose a system in which a color electrical signal, such as RGB, is obtained without using an optical color filter, such as an RGB-CF. Patent Document 1 proposes a color image sensing device in which PN junctions of plural numbers of depth are constituted, by laminating several layers of semiconductor region with alternately different conductive types; accordingly, photoelectric conversion is performed for light in different plural wavelength band regions by the PN junctions of plural numbers of depth, respectively.

Patent Document 2 proposes a color image sensing device in which, in order to obtain RGB chrominance signals by a single pixel without using an RGB-CF, PN junctions of plural numbers of depth are constituted, by laminating several layers of semiconductor region with alternately different conductive types; accordingly photoelectric conversion is performed for light in different plural wavelength band regions by the PN junctions of plural numbers of depth, respectively.

Patent Document 1 and Patent Document 2 both propose elements in which PN junctions of plural numbers of depth are constituted, by laminating several layers of semiconductor region with alternately different conductive types, accordingly photoelectric conversion is performed for light in different plural wavelength band regions by the PN junctions of plural numbers of depth, respectively. According to the elements, a semiconductor is irradiated without using an RGB-CF and there is no attenuation of the light in the RGB-CF when compared with an RGB-CF system, therefore, as one of features, the effective utilization efficiency of light is high. It is not necessary to constitute three pixels independently in two dimensions for every RGB, and three chrominance signals of RGB can be obtained independently from one pixel. Therefore, it is possible to reduce the PD occupied area of a pixel to one third, compared with an RGB-CF system, and it is also possible to attain about three times better resolution than the RGB-CF system, and about three times higher sensitivity than the RGB-CF system.

[Patent Document 1] Japanese Unexamined patent Publication No. Sho 61 (1986)-187282.

[Patent Document 2] Japanese Unexamined patent Publication No. 2003-298038.

DISCLOSURE OF THE INVENTION

Problems that the Invention is to Solve

In Patent Document 1, the PN junctions of plural numbers of depth are constituted by laminating plural layers of semiconductor region with alternately different conductive types in the depth direction of the semiconductor, and each semiconductor layer of each PD is shared alternately in the depth direction. Therefore, there are shortcomings that it is difficult to get signal electrons of each PD independently, because the signal electrons which are photoelectrically converted in each PD may be influenced mutually. Furthermore, there is a problem that a leakage current generated in each PD flows into the other PDs, inducing an error in chrominance signals, such as RGB.

Patent Document 2 makes improvements by providing a semiconductor region which aims at separation between each PD so that each PD may be able to operate independently, and the structure of eight semiconductor regions is formed by laminating seven junctions of PNPNPNPN in the depth direction of the semiconductor. Therefore, shortcomings are that the structure is so complicated that actually manufacturing as a product is extremely difficult.

Examination by the present inventors has clarified that when an incident light to PD arranged directly under an opening of a light shielding film is diffracted by the opening periphery, the direction of the light becomes slanting and the light path length becomes longer, compared with a perpendicular light. This fact means that a light of different wavelength may be detected by the same PD, leading to decrease of a wavelength separation accuracy or a color separation accuracy. It has been also clarified that an undesirable dark current flows in the surface portion of a semiconductor region, on the ground of the contamination on the surface of the semiconductor region due to semiconductor process, leading to decrease of photoelectric conversion accuracy.

The present invention has been made in view of the above circumstances and provides a photoelectric conversion device which adopts the structure of PN junctions of plural numbers of depth, constituted by laminating alternately semiconductor regions with different conductive types in the depth direction of the semiconductor, without using an optical color filter, such as an RGB-CF. Accordingly, the photoelectric conversion device can get a less-noisy electrical signal by improving the color separation property of each light wavelength band and can be actually manufactured as a product by simplifying the structure as much as possible. The present invention also provides an imaging device employing such a photoelectric conversion device.

The other purposes and the new feature of the present invention will become clear from the description of the present specification and the accompanying drawings.

Means for Solving the Problems

The following simply explains an outline of typical one of the inventions disclosed by the present application.

A photoelectric conversion device related to the present invention adopts the structure reflecting the finding that color separation by the photoelectric conversion, which utilizes the difference of the PN junction depth of a semiconductor region, has the strong tendency that separation of a B signal is easy but separation of a G signal and an R signal becomes imperfect. That is, to cope with the tendency of the imperfect color separation of a G signal and an R signal, PN junction surfaces of two PDs for R light and B light are superimposed in the depth direction, and PD for G light is arranged independently. The signal obtained from the shallowest PD for B light provides a converted signal of B light with high accuracy. The signal obtained from the next deeper PD for G light includes the converted signal of B light also. Therefore, the converted signal of G light can be obtained with high accuracy by subtracting the converted signal obtained by PD of B light from the converted signal obtained by PD of G light, in a latter stage circuit. Similarly, the signal obtained by the deepest PD for R light includes the converted signal of B light and the converted signal of G light. Therefore, the converted signal of R light can be obtained with high accuracy by subtracting, from the converted signal obtained by PD of R light, the converted signal obtained by PD of B light and further subtracting the signal of G light produced by the subtraction in the latter stage circuit. Accordingly, the color separation property of each RGB light wavelength band can be improved, the occupying area can be reduced, compared with the case where each PD of RGB light is dispersed in the plane direction, and simplification of the semiconductor layer structure can be realized compared with the case where each PD of RGB light is arranged in the depth direction.

The structure is explained in full detail. The photoelectric conversion device according to the present invention includes a first semiconductor region (1) of a first conductive type (for example, P type), a second semiconductor region (2) and a third semiconductor region (3) of a second conductive type (for example, N type) which are formed in the first semiconductor region, a fourth semiconductor region (4) of the first conductive type formed in the third semiconductor region, and a fifth semiconductor region (5) of the second conductive type formed in the fourth semiconductor region. The first semiconductor region and the second semiconductor region constitute a first photodiode (PDG). The junction surface between the first semiconductor region, constituting an anode of the first photodiode, and the second semiconductor region, constituting a cathode of the first photodiode, has a first depth (DP_G) for photoelectric conversion to light existing in a medium wavelength band and entering from a surface of the first semiconductor region. The fourth semiconductor region and the third semiconductor region constitute a second photodiode (PDR). The junction surface between the fourth semiconductor region, constituting an anode of the second photodiode, and the third semiconductor region, constituting a cathode of the second photodiode, has a second depth (DP_R) for photoelectric conversion to light existing in a long wavelength band and entering from a surface of the first semiconductor region. The fourth semiconductor region and the fifth semiconductor region constitute a third photodiode (PDB). The junction surface between the fourth semiconductor region, constituting an anode of the third photodiode, and the fifth semiconductor region, constituting a cathode of the third photodiode, has a third depth (DP_B) for photoelectric conversion to light existing in a short wavelength band and entering from a surface of the first semiconductor region.

The light in the long wavelength band is red light, the light in the medium wavelength band is green light, and the light in the short wavelength band is blue light.

To cope with the color separation imperfection of a G signal and an R signal when superimposing the PN junction surfaces of three sorts of PDs corresponding to the light wavelengths of RGB in the depth direction, a PD to G light which has a poorest color separation performance is arranged independently, and the PN junction surfaces to two sorts of PDs for R light and B light are superimposed in the depth direction. Accordingly, reduction of the occupying area is attained. It is effective to arrange the superimposed second photodiode and third photodiode, and the first photodiode in a matrix in the shape of a checkered pattern. According to this arrangement, by assigning a pixel for every photodiode in a planar arrangement of the photodiodes arranged in a matrix, and by performing an interpolation color operation using pixels which adjoin mutually in a vertical and a horizontal direction, it is possible to detect an image with the same pixel number as the element number of the array of the photodiodes arranged in a matrix.

As one specific mode of the present invention, the first to the fifth semiconductor region have, over each surface, a high-concentration impurity layer of the first conductive type, and the high-concentration impurity layer couples electrically the first semiconductor region and the fourth semiconductor region. The high-concentration impurity layer acts so as to pull in an undesirable dark current, which flows in the surface portion of a semiconductor region, on the ground of the contamination on the surface of the semiconductor region due to semiconductor process, to a common potential or a ground potential to which the anodes (A_C) of the first to the third photodiode are coupled. Therefore, the situation where such a dark current flows into the cathode and reduces the photoelectric conversion accuracy can be suppressed.

As another specific mode of the present invention, the photoelectric conversion device includes: a first transfer MOS transistor (M1) of which one of a source and a drain is served by the second semiconductor region and of which the other one of the source and the drain is formed by a semiconductor region of the second conductive type provided in the first semiconductor region; a second transfer MOS transistor (M11) of which one of a source and a drain is served by the third semiconductor region and of which the other one of the source and the drain is formed by a semiconductor region of the second conductive type provided in the first semiconductor region; a third transfer MOS transistor (M21) of which one of a source and a drain is served by the fifth semiconductor region and of which the other one of the source and the drain is formed by a semiconductor region of the second conductive type provided in the first semiconductor region; and a charge accumulation-output unit which is provided at each of the first to the third photodiode (ACCG, ACCR, ACCB) and accumulates, via each transfer MOS transistor, charge information produced by a current which is induced by photoelectric conversion and flows in each junction surface, and outputs the accumulated charge information. The imaging cycle using a photoelectric conversion element is classified roughly into a reset cycle, an exposure cycle, and a transfer cycle. In the reset cycle, the transfer MOS transistor is turned on, and an initial charge is stored in the charge accumulation-output unit and the cathode of the photodiode. In the exposure cycle, the transfer MOS transistor is turned off, and the photodiode is rendered to perform photoelectric conversion. In the next transfer cycle, the transfer MOS transistor is turned on, the photoelectron (electron produced by the photoelectric conversion) accumulated in the cathode of the photodiode is transferred to the charge accumulation-output unit, and after turning the transfer MOS transistor off subsequently, a converted signal is taken out from the charge accumulation-output unit. Since the transfer MOS transistor is provided between the charge accumulation-output unit and the cathode of the photodiode, it is possible to suppress that the converted signal becomes unstable under the influence of a noise, when taking out the converted signal from the charge accumulation-output unit. In the constitution in which the charge accumulation-output unit is provided for each of the first to third photodiode, the detection signals to each wavelength of R, G, and B can be outputted in parallel, by parallel operation of the charge accumulation-output unit.

The charge accumulation-output unit may be provided in common at the first photodiode and the second photodiode (ACCRB), and provided exclusively at the third photodiode (ACCG). The occupied area for the case can be made smaller than the above constitution.

The charge accumulation-output unit may be provided in common at the first to the third photodiode (ACCRBG). The occupied area for the case can be made still smaller.

As a yet specific mode, the charge accumulation-output unit includes a source follower output transistor (M2, M12, M22, M32, M42) of which a gate is coupled to the other one of the source and the drain of the transfer MOS transistor, and a reset MOS transistor (M4, M14, M24, M34, M44) which charges selectively a path from the gate of the source follower output transistor to a cathode of the corresponding PD. The reset MOS transistor is turned on in the reset cycle, and turned off in the other cycles.

As a yet specific mode, all or a part of the first to the third transfer MOS transistor, the source follower output transistor, and the reset MOS transistor may employ a bulk MOS transistor. The bulk MOS transistor has, at a boundary surface under a gate, an impurity region of higher impurity concentration than a channel forming layer. In the bulk MOS transistor, a channel is not formed in the surface directly under the gate, and even if undesirable contamination exists in the surface concerned, a channel current cannot be easily influenced by the noise current due to the contamination. Accordingly, a noise reduction effect is expected.

As another specific mode of the present invention, the photoelectric conversion device includes: a light shielding film with openings provided in the respective upper parts of the second semiconductor region and the fifth semiconductor region; a concave lens (23) formed by translucent material and arranged at each of the openings; and a convex lens (24) formed by the translucent material and arranged over the concave lens. The convex lens converges the incident light to a photodiode, and improves the condensing of light. The concave lens can change the condensed light to a parallel light, and is able to render the light enter substantially perpendicular to the photodiode. Accordingly, excellent color separation performance can be obtained as well as the condensing of light.

As another specific mode of the present invention, the photoelectric conversion device includes a light shielding film (22) with openings (21) provided in the respective upper parts of the second semiconductor region and the fifth semiconductor region. The second to the fifth semiconductor regions are formed so as to have the first to the third depth in the direction of a light diffracted outwards at a periphery portion of the opening, similarly as in the direction of a light entering substantially perpendicularly to the opening. Even when the incident light of a photodiode is diffracted at the opening periphery and the direction of the light becomes slanting, the light path length cannot change greatly compared with the perpendicular light; therefore, the accuracy deterioration of the wavelength separation or the color separation in one photodiode can be suppressed.

A solid-state imaging device includes the first photodiode, the superimposed second photodiode and third photodiode, which constitute a photoelectric conversion device and which are arranged in the shape of an array on one semiconductor substrate.

The imaging device includes: a solid-state imaging device; an analog front-end unit which digitizes an image signal produced by the solid-state imaging device; and a digital signal processing processor which generates image data by performing digital signal processing to output data of the analog front-end unit.

A photoelectric conversion device related to another structure of the present invention includes: a first semiconductor region (1) having a first conductive type; a second semiconductor region (2) and a third semiconductor region (3A), both having a second conductive type and arranged in the first semiconductor region; and a fourth semiconductor region (5A) having the second conductive type, arranged in the first semiconductor region, and partly overlapped with the third semiconductor region in the depth direction. The first semiconductor region and the second semiconductor region constitute a first photodiode, and a junction surface between the first semiconductor region, constituting an anode of the first photodiode, and the second semiconductor region, constituting a cathode of the first photodiode, has a first depth for photoelectric conversion to light existing in a medium wavelength band and entering from a surface of the first semiconductor region. The first semiconductor region and the third semiconductor region constitute a second photodiode, and a junction surface between the first semiconductor region, constituting an anode of the second photodiode, and the third semiconductor region, constituting a cathode of the second photodiode, has a second depth for photoelectric conversion to light existing in a long wavelength band and entering from a surface of the first semiconductor region. The first semiconductor region and the fourth semiconductor region constitute a third photodiode, and a junction surface between the first semiconductor region, constituting an anode of the third photodiode, and the fourth semiconductor region, constituting a cathode of the third photodiode, has a third depth for photoelectric conversion to light existing in a short wavelength band and entering from a surface of the first semiconductor region. The present structure is different from the photoelectric conversion device described above in the point that the third semiconductor region has a part embedded in the first semiconductor region in a manner that both surfaces of the part touch with the first semiconductor region. The present structure has the similar function and effect with the photoelectric conversion device described above.

EFFECTS OF THE INVENTION

The following explains briefly the effect acquired by the typical one of the inventions disclosed by the present application.

Namely, it is possible to simplify the structure of PN junctions of plural numbers of depth constituted by laminating alternately semiconductor regions with different conductive types in the depth direction of the semiconductor, without using optical color filters, such as an RGB-CF, and it is also possible to get a less-noisy electrical signal by improving the color separation property of each light wavelength band.

BRIEF DESCRIPTION OF THE DRAWINGS

FIG. 15 is a vertical cross-sectional view illustrating another outline cross-section structure of a photoelectric conversion device which constitutes a solid-state imaging device;

FIG. 16 is a vertical cross-sectional view illustrating yet another outline cross-section structure of a photoelectric conversion device which constitutes a solid-state imaging device;

EXPLANATION OF REFERENCE NUMERALS

Figure 1:
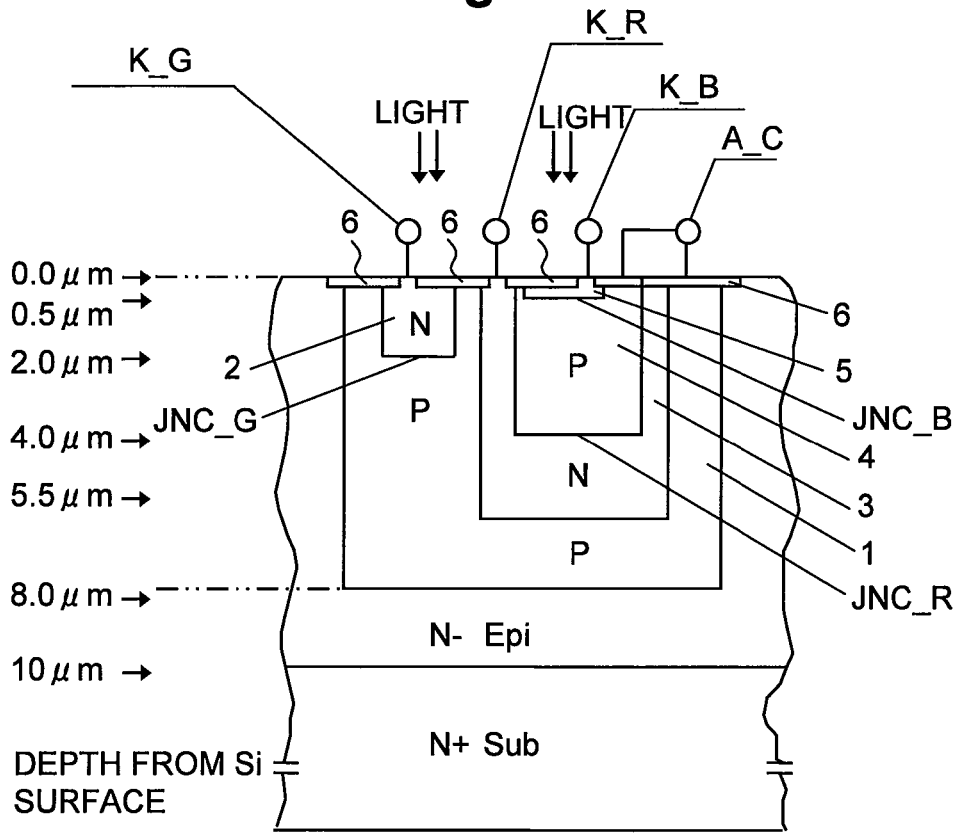
FIG. 1 is an outline sectional view illustrating a photoelectric conversion element which constitutes a solid-state imaging device.

1: First semiconductor region of first conductive type (for example, N type)
2: Second semiconductor region of second conductive type (for example, P type)
3, 3A: Third semiconductor region of second conductive type (for example, P type)
4: Fourth semiconductor region of first conductive type
5: Fifth semiconductor region of second conductive type
5A: Fourth semiconductor region of second conductive type
6: High-concentration impurity layer
JNC_R: PN junction surface of red photodiode
JNC_G: PN junction surface of green photodiode
JNC_B: PN junction surface of blue photodiode
K_R: Cathode terminal of red photodiode
K_G: Cathode terminal of green photodiode
K_B: Cathode terminal of blue photodiode
A_C: Common anode terminal
M1, M11, M21: Transfer MOS transistor
M2, M12, M22, M32, M42: Source follower output MOS transistor
M3, M13, M23, M33, M43: Selection MOS transistor
M4, M14, M24, M34, M44: Reset MOS transistor
ACCR, ACCG, ACCB: Charge accumulation-output unit
10: Gate oxide layer
12: Light shielding film
20: Antireflection film
21: Opening
22: Light shielding film
23: Concave lens
24: Convex lens
30: Solid-state imaging device
34: CDS (Correlated double sampling circuit)
35: GCA (Gain control amplifier)
36: ADC (Analog-digital converter)
38: DSP (Digital signal processing processor)

BEST MODE FOR CARRYING OUT THE INVENTION

FIG. 1 is a basic outline sectional view illustrating a photoelectric conversion element which constitutes a solid-state imaging device as a photoelectric conversion device. The imaging device arranges many photoelectric conversion elements in the shape of an array on one semiconductor silicone substrate.

It is assumed that the semiconductor silicone substrate is of $N^+$-type, for example, and an $N^-$-type area is epitaxially grown on the semiconductor silicone substrate. In the $N^-$-type area, many photoelectric conversion elements are formed at a predetermined pitch in a matrix.

The photoelectric conversion device includes: a first semiconductor region 1, having a first conductive type, for example, a P type, and arranged in the $N^-$-type area; a second semiconductor region 2 and a third semiconductor region 3, both having a second conductive type, for example, an N type, and arranged in the first semiconductor region; a fourth semiconductor region 4, having the first conductive type and arranged in the third semiconductor region; and a fifth semiconductor region 5, having the second conductive type and arranged in the fourth semiconductor region. The first semiconductor region 1 and the second semiconductor region 2 constitute a green photodiode (a first photodiode). The fourth semiconductor region 4 and the third semiconductor region 3 constitute a red photodiode (a second photodiode). The fourth semiconductor region 4 and the fifth semiconductor region 5 constitute a blue photodiode (a third photodiode). The symbol K_G denotes a cathode terminal of the green photodiode. The symbol K_R denotes a cathode terminal of the red photodiode. The symbol K_B denotes a cathode terminal of the blue photodiode. The first semiconductor region 1 through the fifth semiconductor region 5 have a high-concentration impurity layer (a cap layer) 6 of a P type over each surface. The high-concentration impurity layer 6 conducts electrically the first semiconductor region 1 and the fourth semiconductor region 4, and is coupled to a common anode terminal A_C of the green photodiode (PDG), the red photodiode (PDR), and the blue photodiode (PDB).

A junction surface JNC_G between the first semiconductor region 1, constituting the anode of the green photodiode, and the second semiconductor region 2, constituting the cathode of the green photodiode, has a first depth (DP_G) for photoelectric conversion to light existing in a medium wavelength band (for example, green light represented by the wavelength of 520 nm (G light)) and entering from the surface of the first semiconductor region 1. A junction surface JNC_R between the fourth semiconductor region 4, constituting the anode of the red photodiode, and the third semiconductor region 3, constituting cathode of the red photodiode, has a second depth (DP_R) for photoelectric conversion to light existing in a long wavelength band (for example, red light represented by the wavelength of 660 nm (R light)) and entering from the surface of the first semiconductor region 1. A junction surface JNC_B between the fourth semiconductor region 4, constituting the anode of the blue photodiode, and the fifth semiconductor region 5, constituting the cathode of the blue photodiode, has a third depth (DP_B) for photoelectric conversion to light existing in a short wavelength band (for example, blue light represented by the wavelength of 450 nm (B light)) and entering from the surface of the first semiconductor region 1. For example, when the depth of the first semiconductor region 1 is set to 8.0 micrometers (μm), the second depth (DP_R) is set to 4.0 μm, the first depth (DP_G) is set to 2.0 μm, and the third depth (DP_B) is set to 0.5 μm.

The green photodiode, the red photodiode, and the blue photodiode constitute a photoelectric conversion element, respectively. The red photodiode and the blue photodiode are superimposed in the depth direction.

Figure 2:
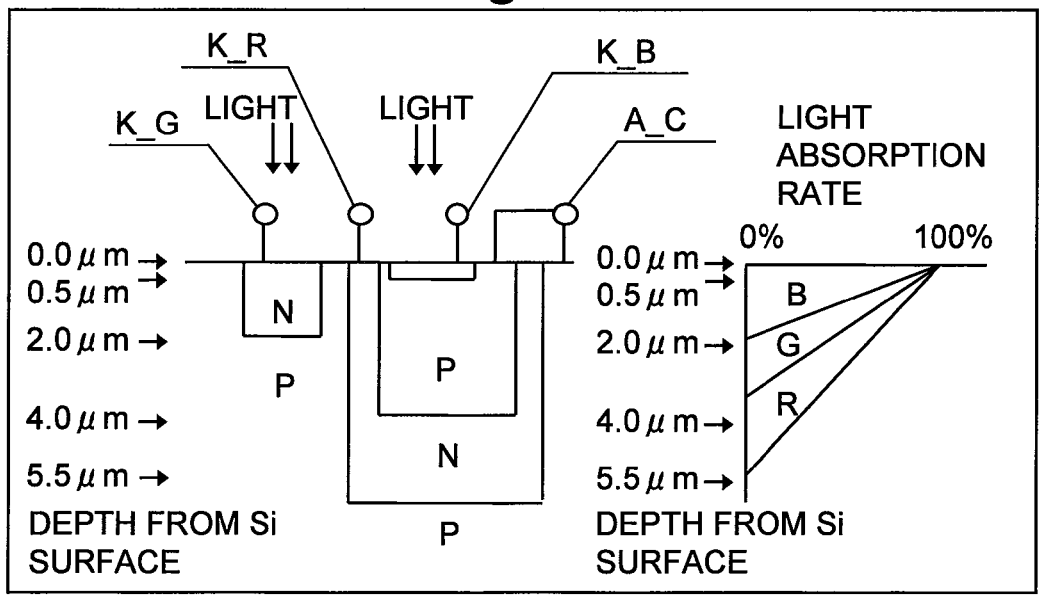
FIG. 2 is an explanatory view schematically illustrating the distance of absorption of light which enters substantially perpendicularly to a Si semiconductor region surface and is absorbed in Si, in contrast with the device cross-section structure of FIG. 1.

FIG. 2 illustrates schematically the distance of absorption of light which enters substantially perpendicularly to a Si semiconductor region surface and is absorbed in Si, in contrast with the device cross-section structure of FIG. 1. According to the example of FIG. 2, B light is absorbed up to about 2.0 μm from the Si semiconductor region surface, G light is absorbed up to about 3.5 μm from the Si semiconductor region surface, and R light is absorbed up to about 5.5 μm from the Si semiconductor region surface. Therefore, if the PN junction depths of a semiconductor region are set differently, the color separation by photoelectric conversion can be performed, even if the PN junction surfaces of the respective RGB light are superimposed in the depth direction. To describe in further detail, the signal obtained from the shallowest PD for B light provides a converted signal of B light with high accuracy. The signal obtained from the next deeper PD for G light includes the converted signal of B light also. Therefore, the converted signal of G light can be obtained with high accuracy by subtracting the converted signal obtained by PD of B light from the converted signal obtained by PD of G light, in a latter stage circuit. Similarly, the signal obtained by the deepest PD for R light includes the converted signal of B light and the converted signal of G light. Therefore, the converted signal of R light can be obtained with high accuracy by subtracting, from the converted signal obtained by PD of R light, the converted signal obtained by PD of B light and further subtracting the signal of G light produced by the subtraction in the latter stage circuit. As clearly seen from FIG. 2, color separation by the photoelectric conversion, which utilizes the difference of the PN junction depth, has the strong tendency that separation of a B signal is easy but separation of a G signal and an R signal becomes imperfect. That is, a great deal of R light is also absorbed in the whole region of a PN junction depth at which G light is absorbed. To cope with the tendency of the imperfect color separation of a G signal and an R signal, the device structure of FIG. 1 constitutes PDs of two sorts of R light and B light by superimposing the respective PN junction surfaces in the depth direction, and arranges PD for G light independently. Accordingly, the color separation property of each light wavelength band of RGB can be improved, the occupied area can be reduced, compared with the case of FIG. 3 where each PD of the RGB light is dispersed in the plane direction, and simplification of the semiconductor layer structure can be realized, compared with the case of FIG. 4 where all of PDs of RGB light are arranged in the depth direction.

The high-concentration impurity layer 6 acts so as to pull in an undesirable dark current, which flows in the surface portion of a semiconductor region, on the ground of the contamination on the surface of the semiconductor region due to semiconductor process, to a common potential or a ground potential to which the anodes (A_C) of the first to the third photodiode are coupled. Therefore, the high-concentration impurity layer 6 contributes to suppress the situation where such a dark current flows into the cathode and reduces the photoelectric conversion accuracy.

Figure 21:
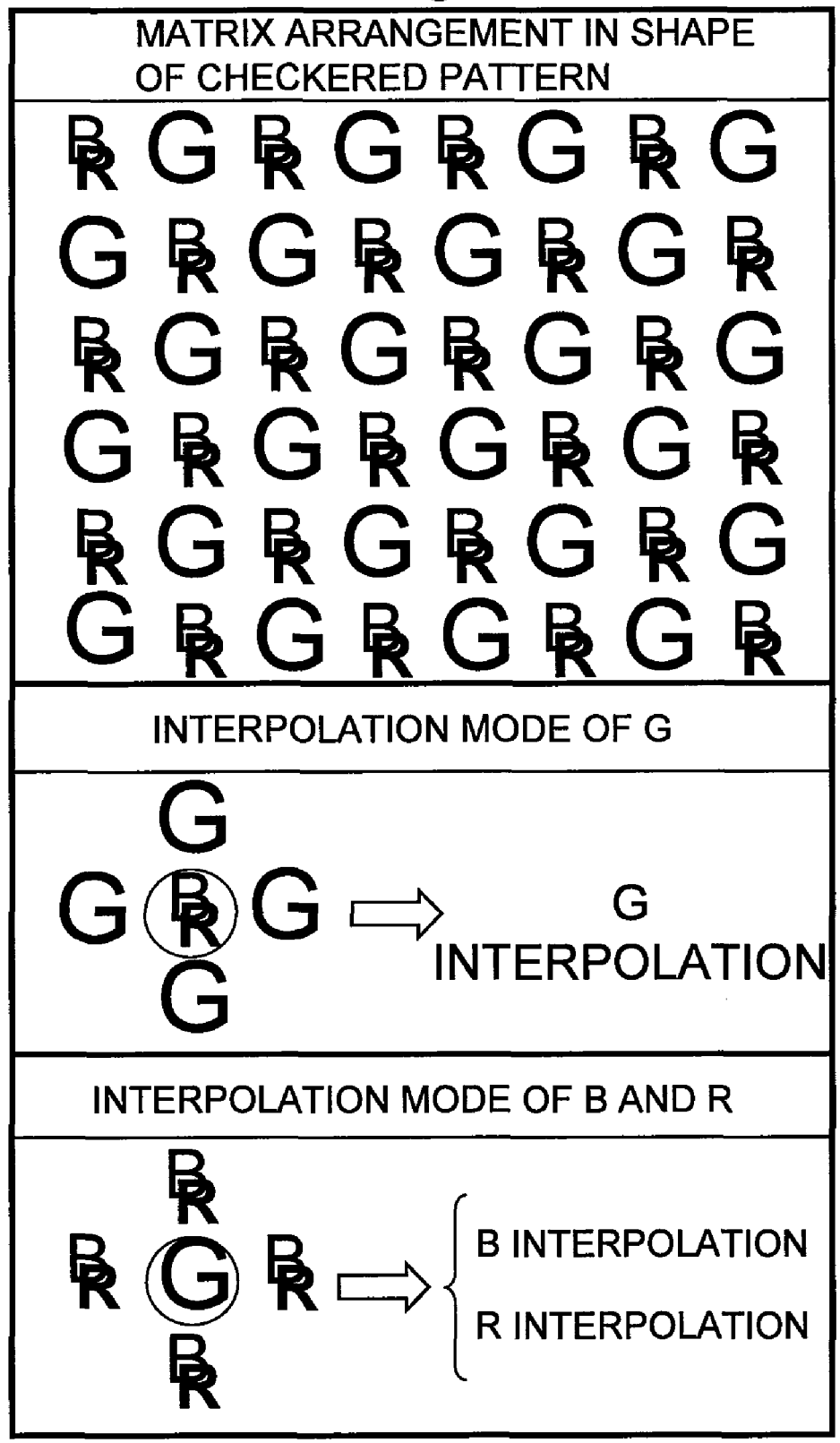
FIG. 21 is an explanatory view illustrating photodiodes arranged in array in the shape of a checkered pattern, and the mode of an interpolation color operation.

To cope with the color separation imperfection of a G signal and an R signal when superimposing the PN junction surfaces of three sorts of PDs corresponding to the light wavelengths of RGB in the depth direction, a PD to G light which has a poorest color separation performance is arranged independently, and the PN junction surfaces to two sorts of PDs for R light and B light are superimposed in the depth direction. Accordingly, reduction of the occupying area is attained. As illustrated in FIG. 21, it is effective to arrange the superimposed second photodiode (R) and third photodiode (B), and the first photodiode (G) in a matrix in the shape of a checkered pattern. According to this arrangement, by assigning a pixel for every photodiode in a planar arrangement of the photodiodes arranged in a matrix, and by performing an interpolation color operation using pixels which adjoin mutually in a vertical and a horizontal direction, it is possible to detect an image with the same pixel number as the element number of the array of the photodiodes arranged in a matrix. The interpolation operation can be performed very simply and with high accuracy, by calculating the arithmetic average of the chrominance signals obtained by the photodiodes corresponding to four surrounding pixels, as illustrated in FIG. 21, for example.

The outline is explained about the manufacturing method of the photoelectric conversion element of FIG. 1. An $N^+$-type silicon semiconductor wafer is prepared and an $N^-$-type semiconductor area is formed in the principal plane by epitaxial growth. A P-type semiconductor area 1 is formed in the N⁻-type semiconductor area by ion implantation and annealing. An N-type semiconductor area 3 is formed in the P-type semiconductor area 1 by ion implantation and annealing. A P-type semiconductor area 4 is formed in the N-type semiconductor area 3 by ion implantation and annealing. Next, an N-type semiconductor area 2 is formed in the P-type semiconductor area 1 by ion implantation and annealing. An N-type semiconductor area 5 is formed in the P-type semiconductor area 4 by ion implantation and annealing. A P⁺-type semiconductor layer is formed thinly (for example, about 0.2 μm in thickness) as a high-concentration impurity layer 6 over the surface by ion implantation and annealing.

Figure 5:
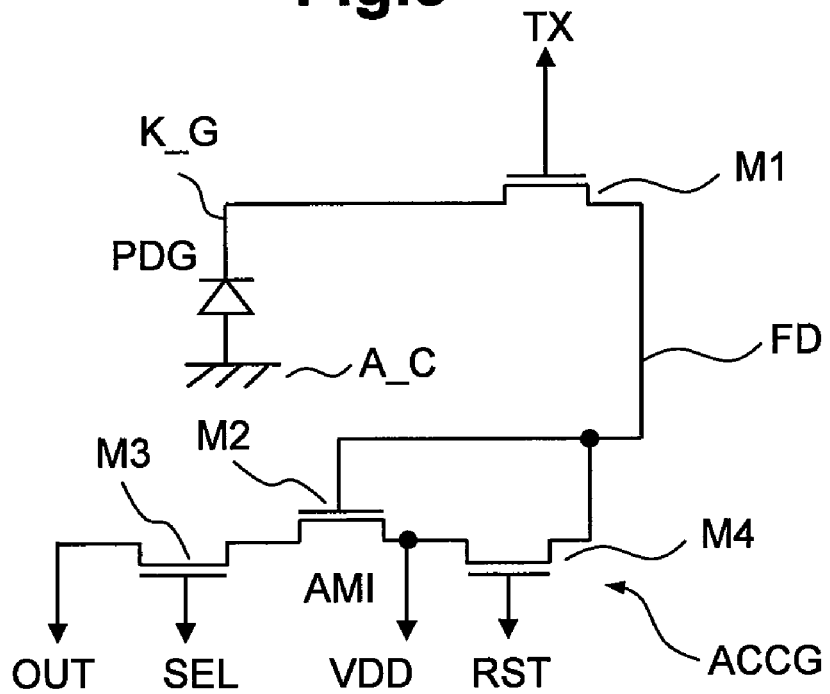
FIG. 5 is a circuit diagram illustrating a green photodiode and a detector circuit of a photoelectric conversion signal by the green photodiode.
Figure 6:
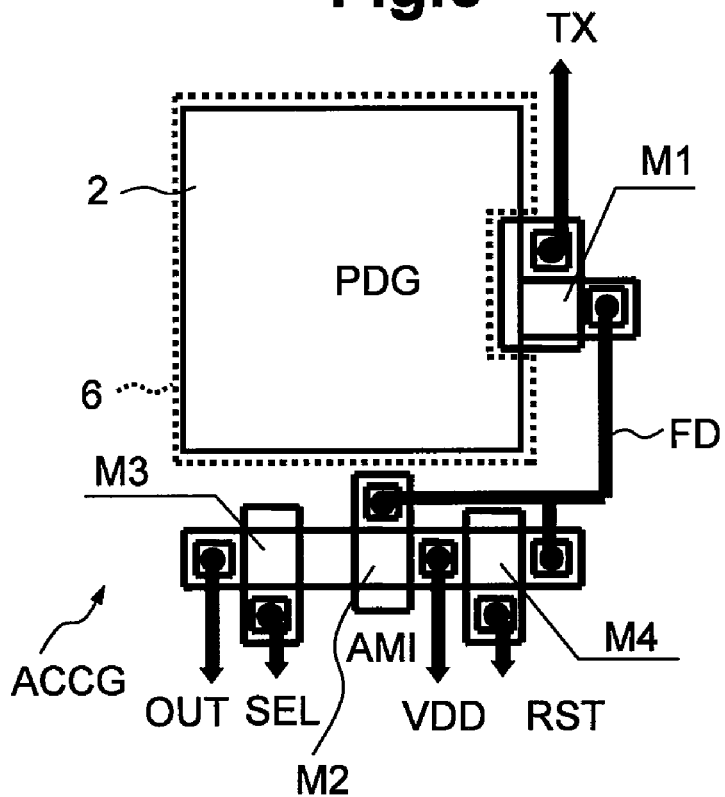
FIG. 6 is an outline view of plane layout illustrating planar structure of the circuit of FIG. 5.

FIG. 5 is a circuit diagram illustrating the green photodiode and a detector circuit of a photoelectric conversion signal by the green photodiode. FIG. 6 is a plane layout illustrating planar structure of the circuit of FIG. 5. The symbol M1 denotes a first transfer MOS transistor of which one of the source and the drain is coupled in series to a cathode terminal K_G of a green photodiode PDG. The present first transfer MOS transistor M1 is coupled to a charge accumulation-output unit ACCG. The charge accumulation-output unit ACCG accumulates, via the first transfer MOS transistor M1, the charge information produced by a current which is induced by photoelectric conversion and flows in the junction surface JNC_G of the green photodiode PDG, and outputs the accumulated charge information. The charge accumulation-output unit ACCG includes: a source follower output MOS transistor M2 of N-channel type; a selection MOS transistor M3 of N-channel type; and a reset MOS transistor M4 of N-channel type. The gate of the source follower output MOS transistor M2 is coupled to the other one of the source and the drain of the transfer MOS transistor M1, and the drain of the source follower output MOS transistor M2 is coupled to a power supply voltage VDD. The selection MOS transistor M3 selects the output of the source follower output MOS transistor M2. The reset MOS transistor M4 charges selectively a path from the gate of the source follower output MOS transistor M2 to the cathode of the corresponding photodiode. The path from the gate of the source follower output MOS transistor M2 to the transfer MOS transistor M1 is configured as a floating diffusion (FD) which has a comparatively large parasitic capacitance. The reset MOS transistor M4 supplies the power supply voltage VDD to the charging node when the reset signal RST is a high level. The selection MOS transistor M3 is controlled to switch by a selection signal SEL.

The imaging cycle using a photoelectric conversion element is classified roughly into a reset cycle, an exposure cycle, and a transfer cycle. In the reset cycle, the selection MOS transistor M3 is turned off, and the transfer MOS transistor M1 and the reset MOS transistor M4 are turned on. As a result, the path from the gate of the source follower output MOS transistor M2 to the cathode K_G is charged with the power supply voltage VDD, and an initial charge is accumulated in the cathode. In the exposure cycle, the MOS transistor M1, M3, and M4 are turned off, and the photoelectric conversion is performed to the photodiode PDG. In the next transfer cycle, the transfer MOS transistor M1 is turned on, and the photoelectron accumulated in the cathode of the photodiode PDG is transferred to FD. Then, after the transfer MOS transistor M1 turned off, the selection MOS transistor M3 is turned on. The detection signal OUT amplified by the source follower output transistor M2 of which the mutual conductance is controlled by the voltage of FD is outputted from the selection MOS transistor M3. Since the transfer MOS transistor M1 is arranged between the charge accumulation-output unit ACCG and the cathode K_G of the photodiode PDG, it is possible to suppress that the detection signal OUT taken out from the charge accumulation-output unit ACCG becomes unstable under the influence of noises due to exposure.

Figure 7:
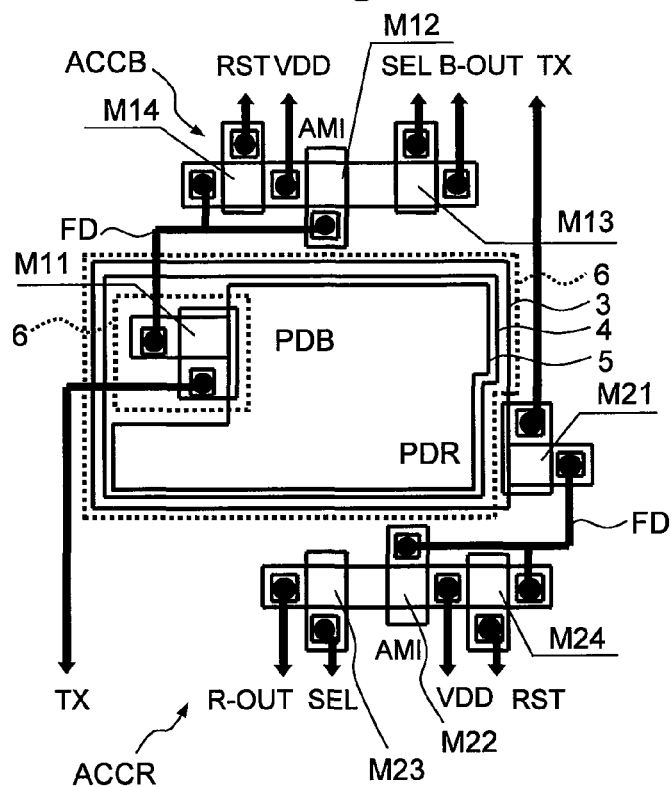
FIG. 7 is an outline view of plane layout illustrating planar structure of a blue photodiode and a red photodiode and a detector circuit for photoelectric conversion signals by the blue photodiode and the red photodiode.

FIG. 7 illustrates planar structure of the blue photodiode PDB and the red photodiode PDR and detector circuits for photoelectric conversion signals by the blue photodiode and the red photodiode. The detector circuit for the photoelectric conversion signal, coupled to the blue photodiode PDB, has a transfer MOS transistor M11 and a charge accumulation-output unit ACCB. The charge accumulation-output unit ACCB includes a source follower output MOS transistor M12, a selection MOS transistor M13, and a reset MOS transistor M14, and acts similarly as explained in FIG. 5. The detector circuit for the photoelectric conversion signal, coupled to the red photodiode PDR, has a transfer MOS transistor M21 and a charge accumulation-output unit ACCR. The charge accumulation-output unit ACCR includes a source follower output MOS transistor M22, a selection MOS transistor M23, and a reset MOS transistor M24, and acts similarly as explained in FIG. 5.

Figure 3:
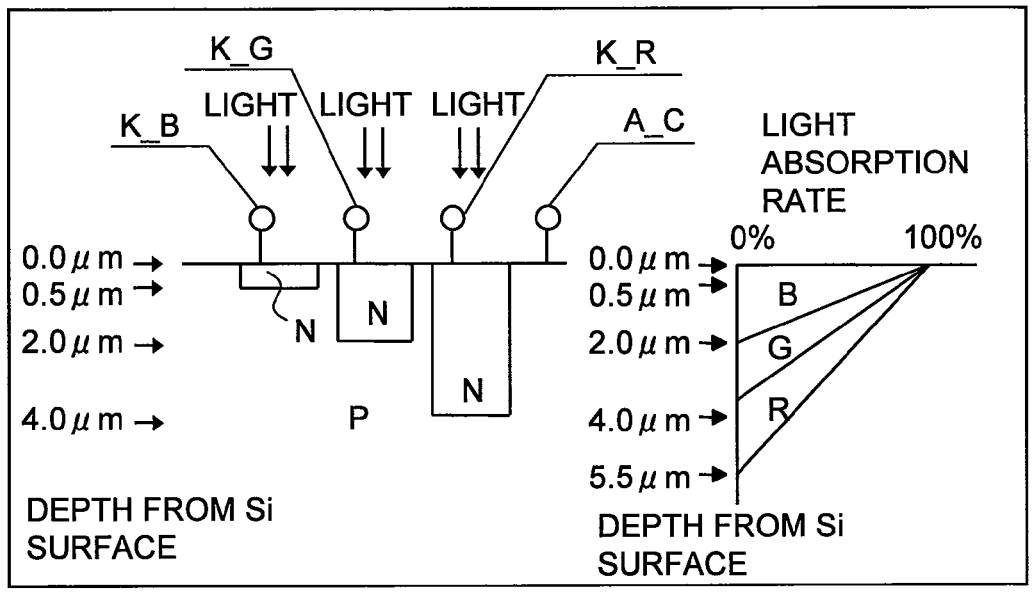
FIG. 3 is an explanatory view illustrating a comparative example in which each PD of RGB light is dispersively arranged in the plane direction.
Figure 4:
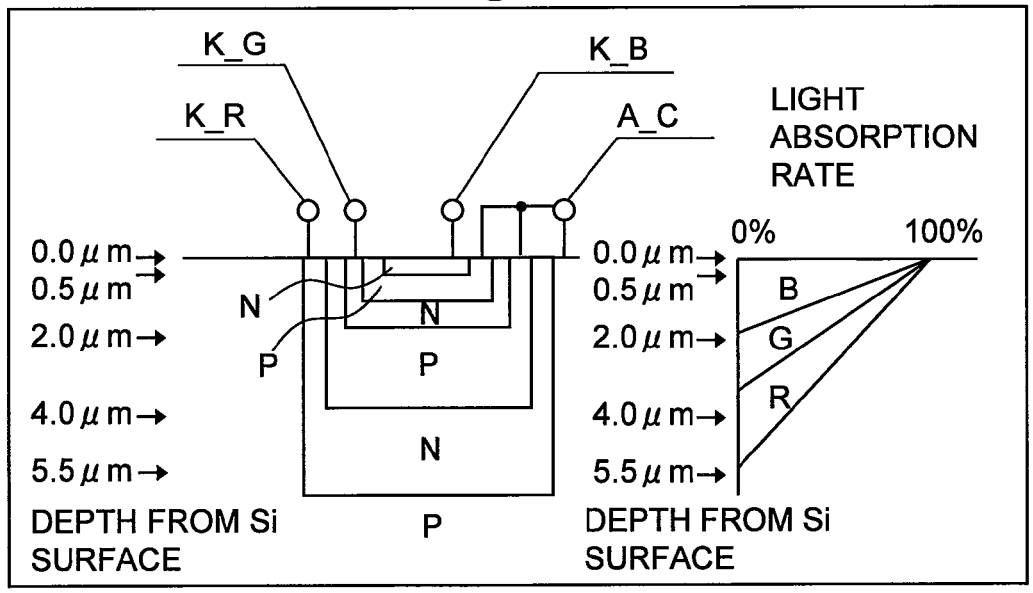
FIG. 4 is an explanatory view illustrating a comparative example in which all of PDs of RGB light are arranged in the depth direction.
Figure 8:
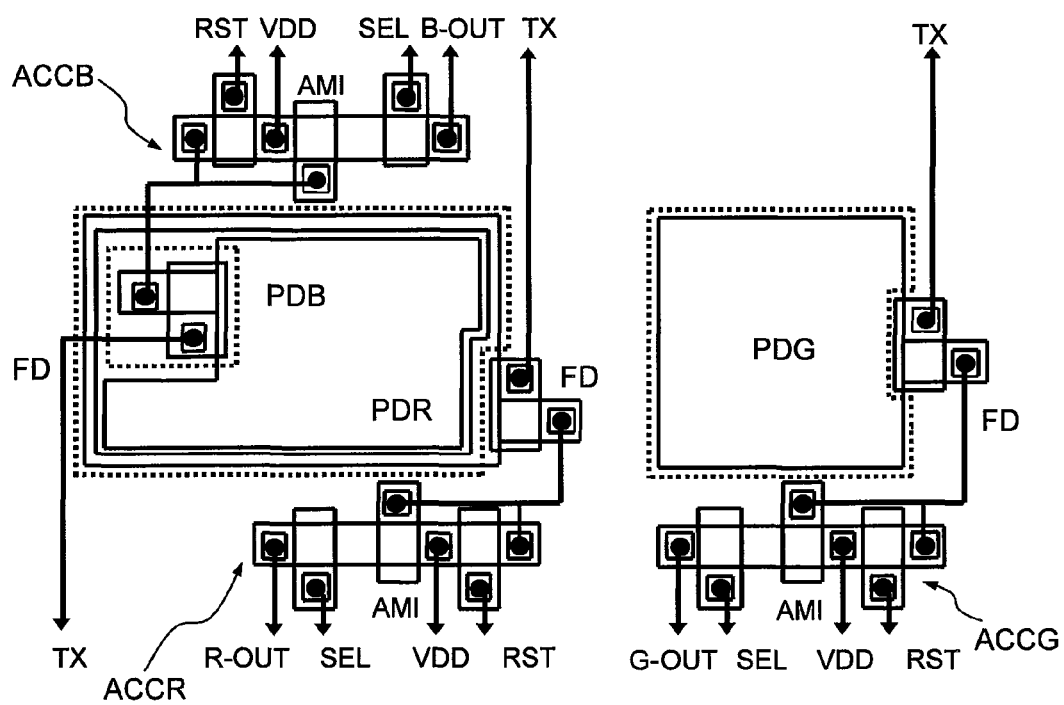
FIG. 8 is an outline view of plane layout pattern illustrating the entire plane constitution of one photoelectric conversion element constituted by the green photodiode of FIG. 6 and the blue photodiode and the red photodiode of FIG. 7.
Figure 9:
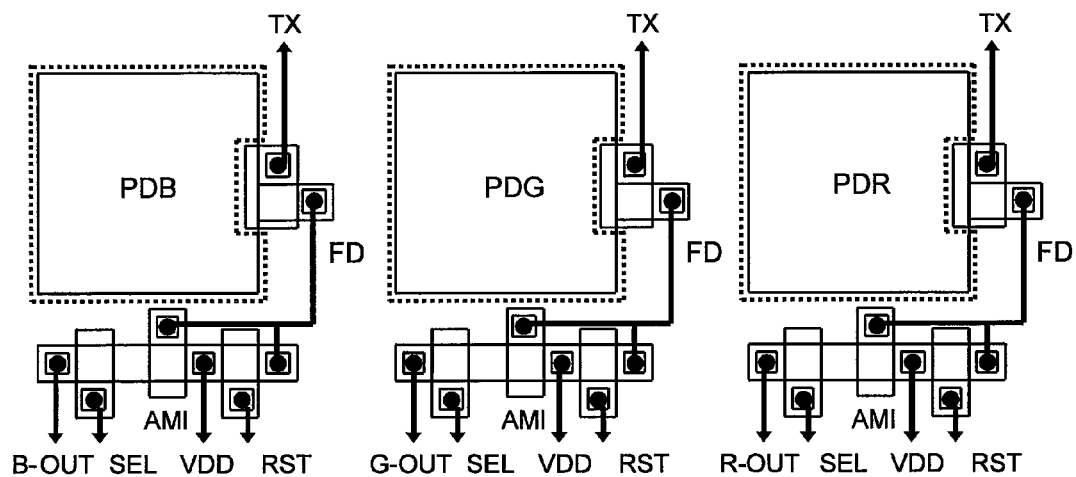
FIG. 9 is an entire layout pattern illustrating one photoelectric conversion element related to the comparative example, corresponding to FIG. 3, in which a green photodiode, a blue photodiode, and a red photodiode are dispersively arranged in plane.

FIG. 8 illustrates the entire layout of one photoelectric conversion element constituted by PDG of FIG. 6 and PDB and PDR of FIG. 7. FIG. 9 illustrates the entire layout of one photoelectric conversion element in which PDG, PDB, and PDR corresponding to FIG. 3 are dispersively arranged in plane. The occupied area of FIG. 8 is smaller than that of FIG. 9. In FIG. 8, since the charge accumulation-output units ACCR, ACCG, and ACCB are provided for every photodiode PDR, PDG, and PDB, it is possible to obtain the parallel output of the detection signals to the wavelengths of R, G, and B, by the parallel operation of the charge accumulation-output units ACCR, ACCG, and ACCB.

Figure 10:
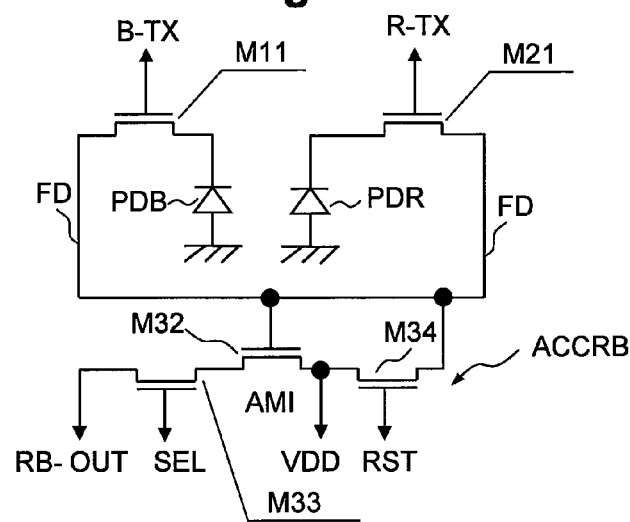
FIG. 10 illustrates a circuit diagram when employing a charge accumulation-output unit ACCRB provided in common to a blue photodiode and a red photodiode.
Figure 11:
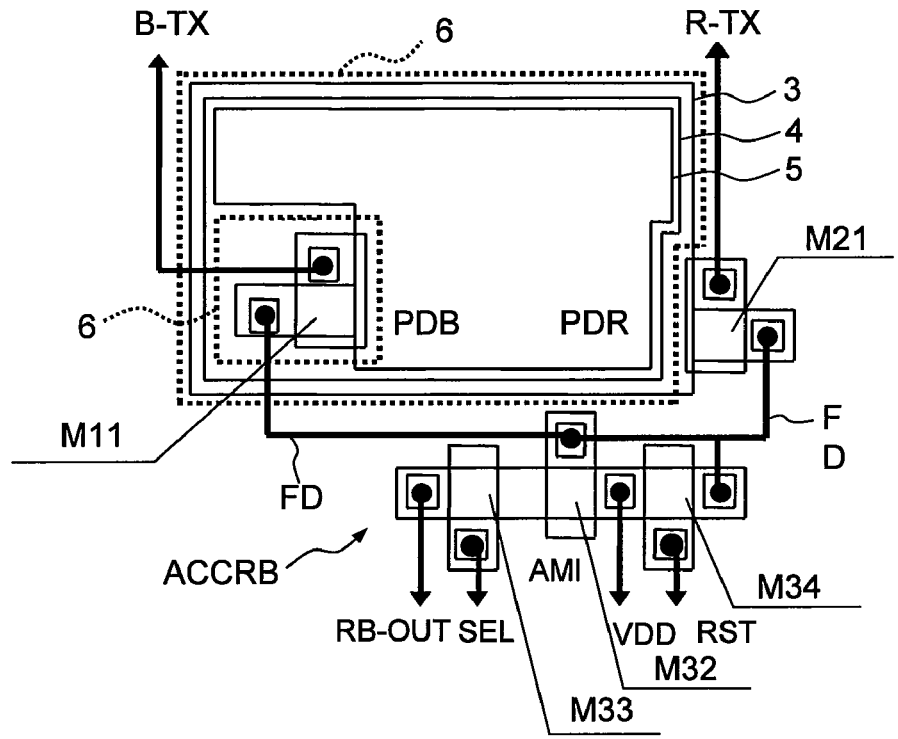
FIG. 11 is a layout pattern illustrating the planar structure of the circuit of FIG. 10.

FIG. 10 illustrates a circuit diagram when employing a charge accumulation-output unit ACCRB provided in common to photodiodes PDR and PDB. FIG. 11 illustrates the planar structure of the circuit of FIG. 10. Here, the charge accumulation-output unit ACCRB includes a source follower output MOS transistor M32, a selection MOS transistor M33, and a reset MOS transistor M34. The gate of the source follower output MOS transistor M32 and the source of the reset MOS transistor M34 are coupled in common to a floating diffusion FD of the photodiode PDR and a floating diffusion FD of the photodiode PDB. In photoelectric conversion operation, the transfer cycle using the charge accumulation-output unit ACCRB is performed by time sharing of the transfer cycle of PDB and the transfer cycle of PDR. The occupied area of FIG. 11 is smaller than that of FIG. 7.

Figure 12:
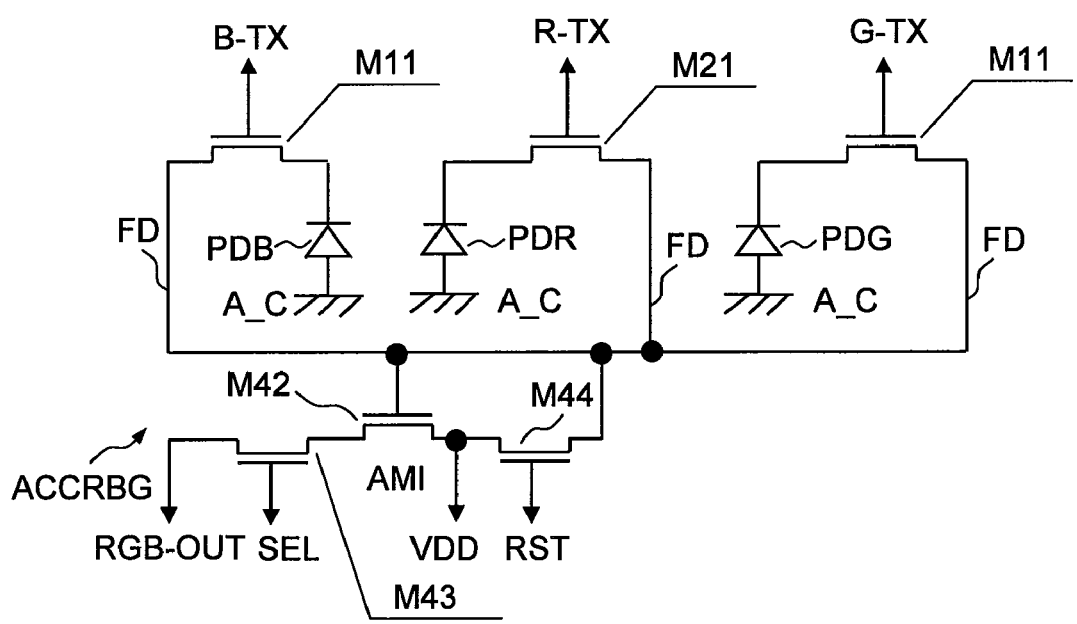
FIG. 12 is a circuit diagram when employing a charge accumulation-output unit ACCRBG provided in common to a green photodiode, a blue photodiode, and a red photodiode.
Figure 13:
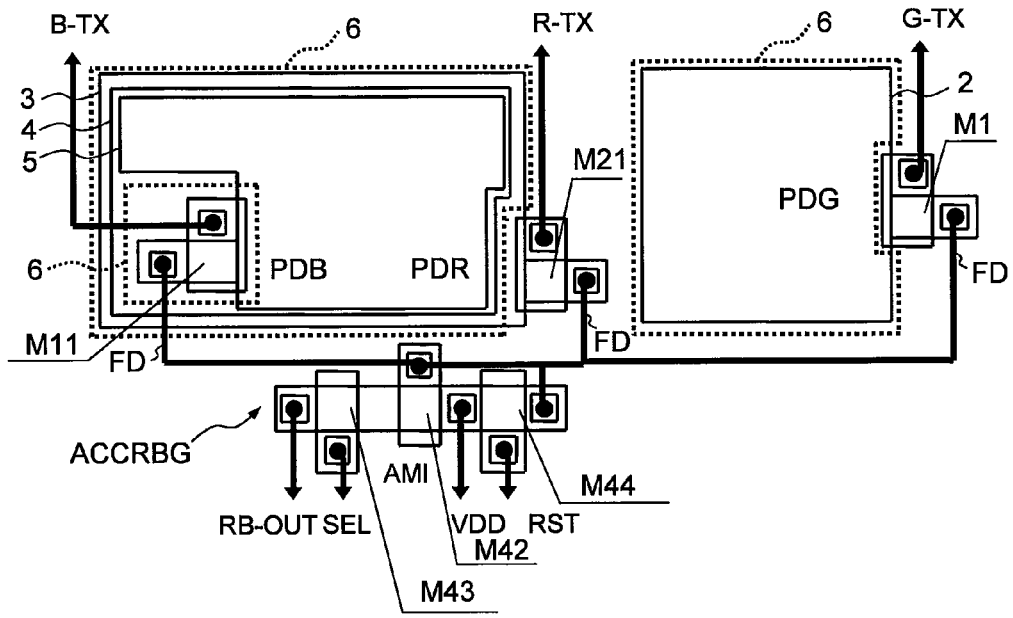
FIG. 13 is a layout pattern illustrating the planar structure of the circuit of FIG. 12.

FIG. 12 illustrates a circuit diagram when employing a charge accumulation-output unit ACCRBG provided in common to photodiodes PDR, PDB, and PDG. FIG. 13 illustrates the planar structure of the circuit of FIG. 12. Here, the charge accumulation-output unit ACCRBG includes a source follower output MOS transistor M42, a selection MOS transistor M43, and a reset MOS transistor M44. The gate of the source follower output MOS transistor M42 and the source of reset MOS transistor M44 are coupled in common to the respective floating diffusions FDs of photodiodes PDR, PDG, and PDB. In photoelectric conversion operation, the transfer cycle using the charge accumulation-output unit ACCRBG is performed by time sharing of the transfer cycle of PDB, the transfer cycle of PDR, and the transfer cycle of PDG. The occupied area of FIG. 13 is smaller than that of FIG. 11.

Figure 14:
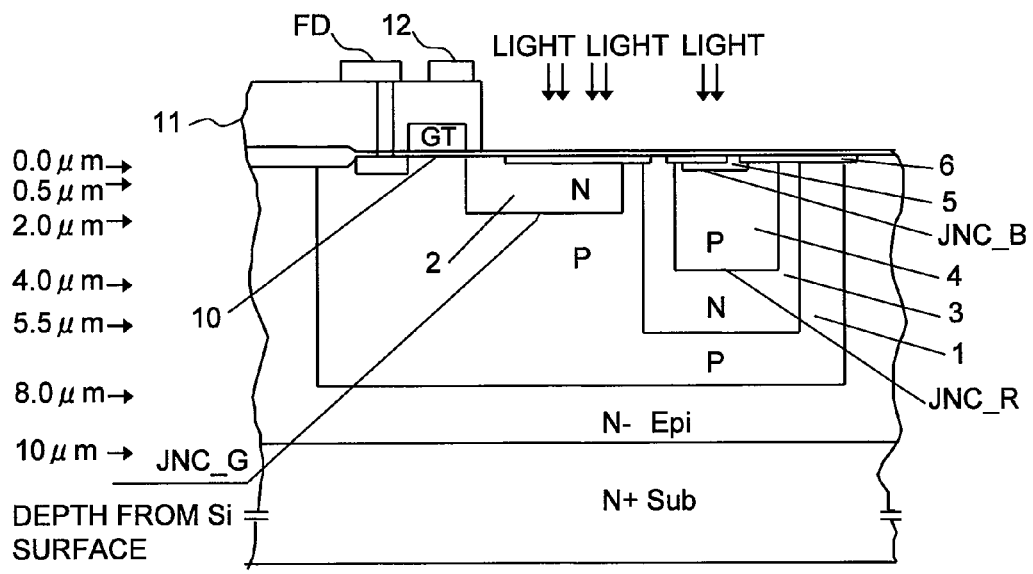
FIG. 14 is a vertical cross-sectional view illustrating a still-more-detailed vertical section structure of a photoelectric conversion device to which a transfer MOS transistor is added.

FIG. 14 illustrates a still-more-detailed vertical section structure of a photoelectric conversion device to which a transfer MOS transistor is added. The symbol 10 denotes a gate oxide layer and the gate (GT) of the transfer MOS transistor is formed through this gate oxide layer 10. Over that, a light shielding film 12 and a floating diffusion FD are formed through an interlayer insulation film 11.

Figure 20:
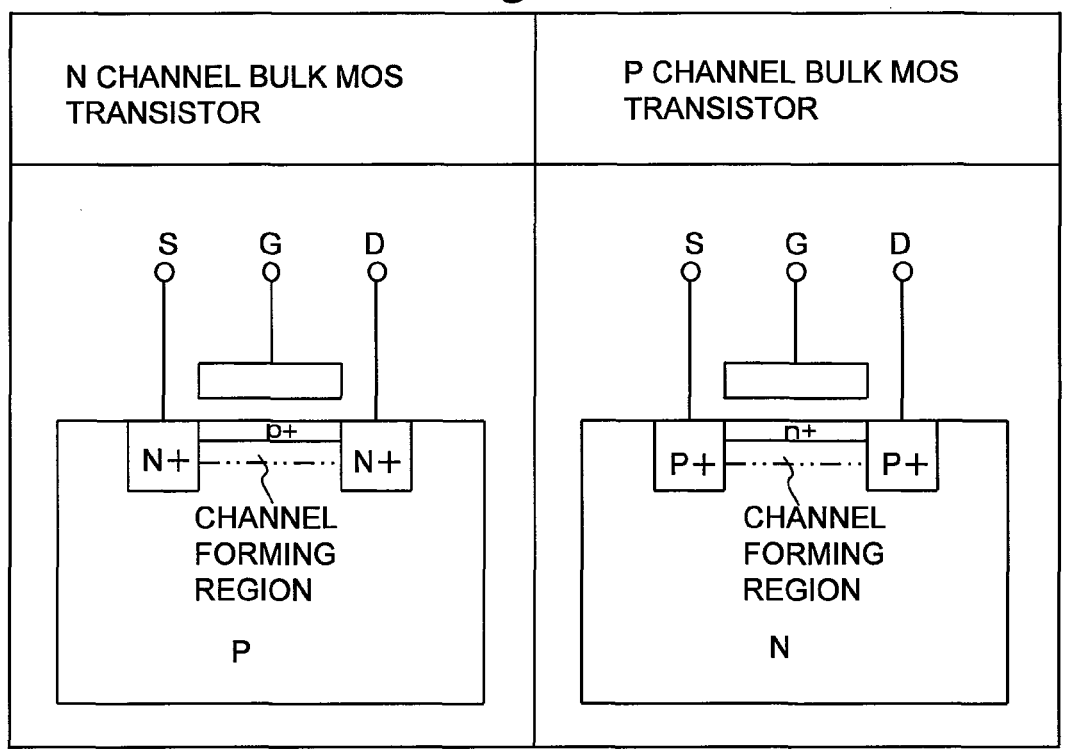
FIG. 20 is a vertical cross-sectional view of a bulk MOS transistor.

All or a part of the transfer MOS transistors M1, M11, and M21, the selection transistors M3, M13, M23, M33, and M43, the source follower output transistors M2, M12, M22, M32, and M42, and the reset MOS transistors M4, M14, M24, M34, and M44, may employ a bulk MOS transistor of FIG. 20 and noise can be reduced. Namely, the bulk MOS transistor has structure in which the diffusion layer whose impurity concentration is deeper than in the channel forming layer is provided in the interface under the gate, and a carrier is made to pass only the bulk, without passing the interface. Therefore, noise can be reduced.

FIG. 15 illustrates another outline cross-section structure of a photoelectric conversion device which configures a solid-state imaging device. It is assumed that the semiconductor silicone substrate is of $N^+$-type, for example, and an $N^-$-type area is epitaxially grown on the semiconductor silicone substrate. In the $N^-$-type area, many photoelectric conversion elements are formed at a predetermined pitch in a matrix.

The photoelectric conversion element includes a first semiconductor region 1 of a first conductive type, for example, a P type, formed in the $N^-$-type area, and a second semiconductor region 2 and a third semiconductor region 3A of a second conductive type, for example, an N type, which are arranged in the first semiconductor region 1. Although the second semiconductor region 2 is shaped like a pillar same as in the above, the third semiconductor region 3A is shaped like a stepped pillar with a step attached at the intermediate point in the depth direction, the cross-sectional area of the deep portion is formed larger than the cross-sectional area of the shallow portion, and the upper and lower surfaces of the deep part of the third semiconductor region 3A contact the first semiconductor region 1. In short, the first semiconductor region and the fourth semiconductor region in FIG. 1 are formed in a unified shape. A semiconductor region 5A of the same N type as the fifth semiconductor region is formed in the position which overlaps with the deep part of the third semiconductor region 3A in the first semiconductor region 1. A blue photodiode is configured by the junction surface JNC_B between the semiconductor region 5A and the first semiconductor region 1. A red photodiode is configured by the junction surface JNC_R between the third semiconductor region 3 and the first semiconductor region 1. A green photodiode is configured by the junction surface JNC_G between the first semiconductor region 1 and the second semiconductor region 2. Other constitution is the same as the photoelectric conversion element explained in FIG. 1, therefore, the detailed explanation thereof is omitted. The photoelectric conversion element of this structure also functions similarly as the photoelectric conversion element described above.

FIG. 16 illustrates yet another outline cross-section structure of a photoelectric conversion device which constitutes a solid-state imaging device. The photoelectric conversion element illustrated in FIG. 16 is different from the structure of FIG. 14 in the point that the cathode terminal K_B of the blue photodiode is arranged next to the cathode terminal K_G of the green photodiode. Since other constitution is the same as that of FIG. 15, the detailed explanation thereof is omitted. The photoelectric conversion element of this structure also functions similarly as the photoelectric conversion element described above.

Figure 17:
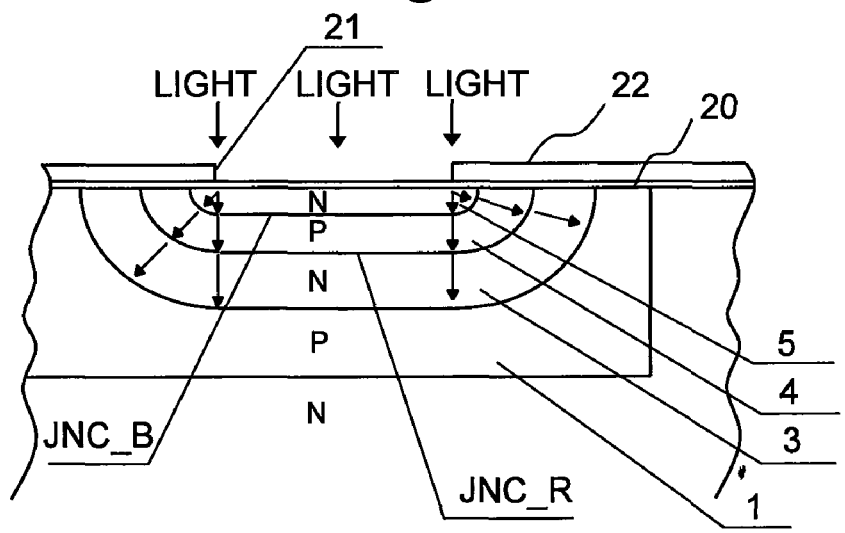
FIG. 17 is a vertical cross-sectional view illustrating circular vertical section structure in both ends of a third to a fifth semiconductor region, as another example of the shape of the laminated semiconductor regions.

FIG. 17 illustrates circular vertical section structure in both ends of a third to a fifth semiconductor region, as another example of the shape of the laminated semiconductor regions.

An antireflection film 20 is formed over the surface of the semiconductor region, and a light shielding film 22 with an opening 21 formed above the fifth semiconductor region 5 is provided. The third semiconductor region 3 to the fifth semiconductor region 5 are formed so as to have the second depth (DP_R) and the third depth (DP_B) in the direction of a light diffracted outwards at a periphery portion of the opening 21, similarly as in the direction of a light entering substantially perpendicularly to the opening 21. Even when the incident light is diffracted at the periphery of the opening 21 and the direction of the light becomes slanting, the light path length cannot change greatly compared with the perpendicular light; therefore, the accuracy deterioration of the wavelength separation or the color separation in one photodiode can be suppressed. Although not illustrated in particular, also as for the PN junction surface JNC_G of the green photodiode, both ends of the second semiconductor region 2 may be preferably shaped circularly at the second depth. The antireflection film 20 functions also as a protective film (a passivation film) and may be formed by depositing at least one of $SiO_2$, SiON, and SiN, by a molecule deposition method. The light shielding film 22 may be formed by applying resin of a pigment including a black dye, for example, by a photoengraving construction method.

Figure 18:
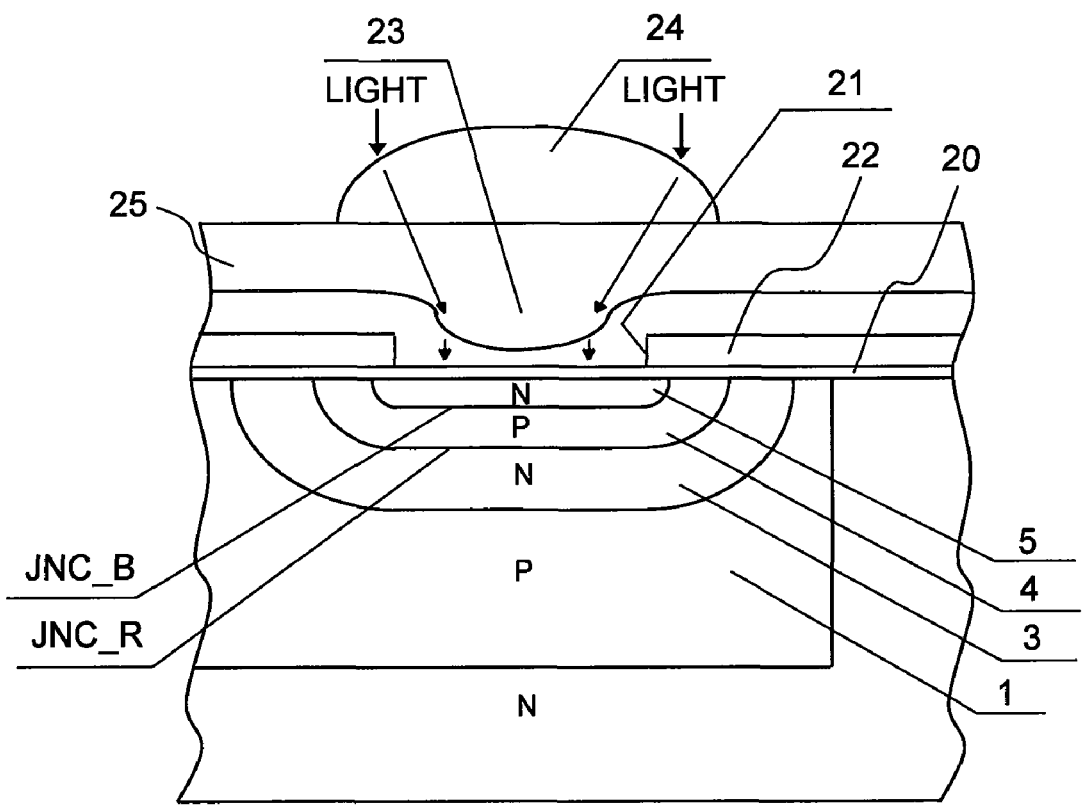
FIG. 18 is a vertical cross-sectional view illustrating vertical section structure which combines a lens with a red light photodiode and a blue light photodiode superimposed in the vertical direction, as another example in which the lens is arranged in front of a photoelectric conversion element.

FIG. 18 illustrates vertical section structure which combines a lens with a red photodiode and a blue photodiode superimposed in the vertical direction, as another example in which the lens is arranged in front of a photoelectric conversion element. Over the upper surface of the antireflection film 20, a light shielding film 22 with an opening 21 formed at the upper position of the fifth semiconductor region 5 is formed. A concave lens 23 formed by translucent material is disposed in the opening 21, and a convex lens 24 formed by translucent material is disposed over the concave lens 23. The convex lens 24 converges the incident light to the photodiode and improves the condensing of light. The concave lens 23 changes the condensed light to a parallel light, and make the light enter substantially perpendicularly to the photodiode. With the combination of the concave lens 23 and the convex lens 24, excellent color separation performance as well as condensing of light can be obtained.

The concave lens 23 can be formed in the following way. That is, a light-transparent resin is applied over the light shielding film 22 and the antireflection film 20, the present resin in the opening 21 (the light-sensitive section) is gouged out by a photoengraving construction method; subsequently, roundness is given to the shape to form a concave by melting by heat, and the concave lens 23 is formed. By applying a light transparent resin over the upper part of the present concave lens 23, a planarizing layer (a planarizing film) 25 is made. The convex lens 24 can be formed in the following way. That is, a light transparent resin is applied over the upper part of the planarizing layer 25, the applied resin is arranged to a shape of a cylinder or the like at a light-sensitive section by a photoengraving construction method; subsequently, roundness is given to the shape to form a convex by melting by heat, and the convex lens 24 is formed.

The light shielding films 22 may be formed from metal silicide films, such as tungsten silicide (WSi), molybdenum silicide (MoSi), and titanium silicide (TiSi), or it may be formed from metal films, such as tungsten (W), molybdenum (Mo), titanium (Ti), and wiring metal aluminum (Al). Sputtering or CVD is used to form the light shielding films 22. When forming the light shielding film from a metal silicide film or a metal film, boron-phosphorus silicide glass (BPSG) may be formed over the surface of the light shielding film by CVD.

Figure 19:
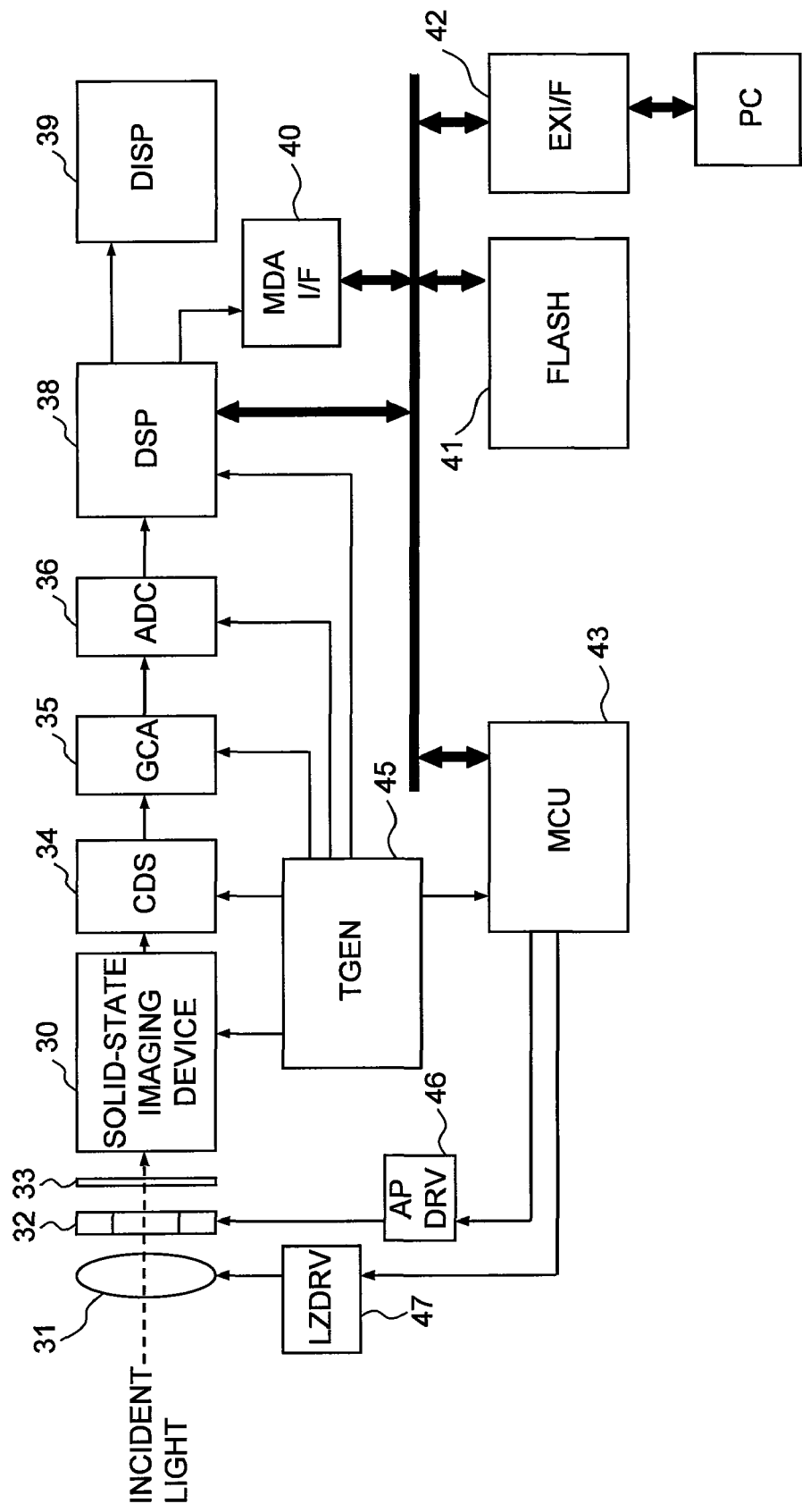
FIG. 19 is a system configuration diagram illustrating an imaging device using a photoelectric conversion device according to the present invention.

FIG. 19 illustrates the system configuration of an imaging device. The symbol 30 denotes a solid-state imaging device which is formed, for example, by a CMOS integrated circuit manufacturing method. The solid-state imaging device 30 is constituted by photoelectric conversion elements arranged in the shape of an array on one semiconductor substrate. An optical image (light) enters into the solid-state imaging device 30 through a lens 31, a aperture diaphragm 32, an infrared ray cut filter and optical LPF 33. The solid-state imaging device 30 performs the color conversion of RGB to the incident light, and outputs a detection signal (image signal). An analog front-end unit to digitize the image signal includes CDS (correlated double sampling circuit) 34, GCA (gain control amplifier) 35, and ADC (analog-digital converter) 36. DSP (digital signal processing processor) 38 performs digital signal processing to the output of ADC 36 to generate image data. The image data is displayed by DISP (LCD display) 39, and also stored in a flash memory (FLASH) 41 or the like through a media interface (MDAI/F) 40. It is also possible to output the image data to an external PC (personal computer) etc. through an external interface (EXI/F) 42. A data processor (MCU) 43 controls the entire system. A timing generator (TGEN) 45 performs timing control to the analog front-end unit. An aperture diaphragm driver (APDRV) 46 drives the aperture diaphragm 32. A lens driver (LZDRV) 47 performs focus control of the lens 31.

In the above, the invention accomplished by the present inventors has been specifically explained based on the embodiments. However, it cannot be overemphasized that the present invention is not restricted to the embodiments, and it can be changed variously in the range which does not deviate from the gist.

For example, a P-type substrate may be used as the silicon semiconductor substrate. The MOS transistor which constitutes the charge accumulation-output unit is not restricted to an N-channel type, but may use a P-channel MOS transistor in part. It is needless to say that the PN junction depth of each photodiode of RGB is not restricted to the explanation given above but it can be changed suitably.

INDUSTRIAL APPLICABILITY

The present invention is widely applicable to a solid-state imaging device and a photoelectric conversion element which constitute an image input device or an imaging device, such as a video camera, a digital still camera, and a scanner.

What is claimed is:

1. A Photoelectric conversion device comprising:
a first semiconductor region having a first conductive type;
a second semiconductor region and a third semiconductor region, both having a second conductive type and arranged in the first semiconductor region;
a fourth semiconductor region having the first conductive type and arranged in the third semiconductor region; and
a fifth semiconductor region having the second conductive type and arranged in the fourth semiconductor region,
wherein the first semiconductor region and the second semiconductor region constitute a first photodiode, and a junction surface between the first semiconductor region constituting an anode of the first photodiode and the second semiconductor region constituting a cathode of the first photodiode has a first depth for photoelectric conversion to light existing in a medium wavelength band and entering from a surface of the first semiconductor region,
wherein the fourth semiconductor region and the third semiconductor region constitute a second photodiode, and a junction surface between the fourth semiconductor region constituting an anode of the second photodiode and the third semiconductor region constituting a cathode of the second photodiode has a second depth for photoelectric conversion to light existing in a long wavelength band and entering from a surface of the first semiconductor region, and
wherein the fourth semiconductor region and the fifth semiconductor region constitute a third photodiode, and a junction surface between the fourth semiconductor region constituting an anode of the third photodiode and the fifth semiconductor region constituting a cathode of the third photodiode has a third depth for photoelectric conversion to light existing in a short wavelength band and entering from a surface of the first semiconductor region.

2. The photoelectric conversion device according to claim 1,
wherein the superimposed second photodiode and third photodiode and the first photodiode are arranged in a matrix in the shape of a checkered pattern.

3. The photoelectric conversion device according to claim 1,
wherein the light in the long wavelength band is red light, the light in the medium wavelength band is green light, and the light in the short wavelength band is blue light.

4. The photoelectric conversion device according to claim 1,
wherein the first to the fifth semiconductor region have, over each surface, a high-concentration impurity layer of the first conductive type, and
wherein the high-concentration impurity layer couples electrically the first semiconductor region and the fourth semiconductor region.

5. The photoelectric conversion device according to claim 1, further comprising:
a first transfer MOS transistor of which one of a source and a drain is served by the second semiconductor region and of which the other one of the source and the drain is formed by a semiconductor region of the second conductive type provided in the first semiconductor region;
a second transfer MOS transistor of which one of a source and a drain is served by the third semiconductor region and of which the other one of the source and the drain is formed by a semiconductor region of the second conductive type provided in the first semiconductor region; and
a third transfer MOS transistor of which one of a source and a drain is served by the fifth semiconductor region and of which the other one of the source and the drain is formed by a semiconductor region of the second conductive type provided in the first semiconductor region,
wherein a charge accumulation-output unit is provided at each of the first to the third photodiode, the charge accumulation-output unit being operable to accumulate, via each transfer MOS transistor, charge information produced by a current which is induced by photoelectric conversion and flows in each junction surface, and operable to output the accumulated charge information.

6. The photoelectric conversion device according to claim 1, further comprising:
a first transfer MOS transistor of which one of a source and a drain is served by the second semiconductor region and of which the other one of the source and the drain is formed by a semiconductor region of the second conductive type provided in the first semiconductor region;

a second transfer MOS transistor of which one of a source and a drain is served by the third semiconductor region and of which the other one of the source and the drain is formed by a semiconductor region of the second conductive type provided in the first semiconductor region; and a third transfer MOS transistor of which one of a source and a drain is served by the fifth semiconductor region and of which the other one of the source and the drain is formed by a semiconductor region of the second conductive type provided in the first semiconductor region, wherein a charge accumulation-output unit is provided in common at the first photodiode and the second photodiode and provided exclusively at the third photodiode, the charge accumulation-output unit being operable to accumulate, via each transfer MOS transistor, charge information produced by a current which is induced by photoelectric conversion and flows in each junction surface, and operable to output the accumulated charge information.

7. The photoelectric conversion device according to claim 1, further comprising:

a first transfer MOS transistor of which one of a source and a drain is served by the second semiconductor region and of which the other one of the source and the drain is formed by a semiconductor region of the second conductive type provided in the first semiconductor region;

a second transfer MOS transistor of which one of a source and a drain is served by the third semiconductor region and of which the other one of the source and the drain is formed by a semiconductor region of the second conductive type provided in the first semiconductor region; and a third transfer MOS transistor of which one of a source and a drain is served by the fifth semiconductor region and of which the other one of the source and the drain is formed by a semiconductor region of the second conductive type provided in the first semiconductor region, wherein a charge accumulation-output unit is provided in common at the first to the third photodiode, the charge accumulation-output unit being operable to accumulate, via each transfer MOS transistor, charge information produced by a current which is induced by photoelectric conversion and flows in each junction surface, and operable to output the accumulated charge information.

8. The photoelectric conversion device according to claim 5, wherein all or a part of the first to the third transfer MOS transistor are bulk MOS transistors, and wherein each of the bulk MOS transistors has, at a boundary surface under a gate, an impurity region of higher impurity concentration than a channel forming layer.

9. The photoelectric conversion device according to claim 5, wherein the charge accumulation-output unit includes:

a source follower output transistor of which a gate is coupled to the other one of the source and the drain of each transfer MOS transistor; and a reset MOS transistor operable to charge selectively a path from the gate of the source follower output transistor to a cathode of the corresponding photodiode.

10. The photoelectric conversion device according to claim 9, wherein all or a part of the first to the third transfer MOS transistor, the source follower output transistor, and the reset MOS transistor are bulk MOS transistors, and wherein each of the bulk MOS transistors has, at a boundary surface under a gate, an impurity region of higher impurity concentration than a channel forming layer.

11. A solid-state imaging device comprising:

a first photodiode;
a second photodiode; and
a third photodiode, wherein the first photodiode, the second photodiode, and the third photodiode constitute the photoelectric conversion device according to claim 1, and wherein the first photodiode and the superimposed second photodiode and third photodiode are arranged in a matrix on a semiconductor substrate.

12. An imaging device comprising:

a solid-state imaging device according to claim 11;

an analog front-end unit operable to digitize an image signal produced by the solid-state imaging device; and a digital signal processing processor operable to generate image data by performing digital signal processing to output data of the analog front-end unit.

* * * * *